(12) United States Patent
Takahashi et al.

(10) Patent No.: US 7,025,895 B2
(45) Date of Patent: Apr. 11, 2006

(54) PLASMA PROCESSING APPARATUS AND METHOD

(75) Inventors: Youji Takahashi, Kudamatsu (JP); Makoto Kashibe, Tokuyama (JP)

(73) Assignee: Hitachi High-Technologies Corporation, Tokyo (JP)

(*) Notice: Subject to any disclaimer, the term of this patent is extended or adjusted under 35 U.S.C. 154(b) by 513 days.

(21) Appl. No.: 10/218,422

(22) Filed: Aug. 15, 2002

(65) Prior Publication Data

US 2004/0031566 A1    Feb. 19, 2004

(51) Int. Cl.
  C23C 16/00   (2006.01)
  C23C 14/35   (2006.01)
  C23F 1/00    (2006.01)

(52) U.S. Cl. .......................... 216/67; 216/69; 216/59; 156/345.24; 156/345.28; 438/710; 204/298.03; 204/298.32; 204/192.13; 204/192.33; 118/723 E; 422/186.04

(58) Field of Classification Search ........... 422/186.04, 422/186.29; 216/67, 69, 59, 60, 61; 156/345.24, 156/345.28; 438/710; 204/298.03, 192.13, 204/298.32, 192.33; 118/723 E; 427/10
See application file for complete search history.

(56) References Cited

U.S. PATENT DOCUMENTS

| 4,263,088 A * | 4/1981 | Gorin ............................ 438/9 |
| 4,808,258 A * | 2/1989 | Otsubo et al. .............. 438/710 |
| 6,720,268 B1 * | 4/2004 | Laermer et al. ............ 438/700 |

* cited by examiner

*Primary Examiner*—Rodney G. McDonald
(74) *Attorney, Agent, or Firm*—Antonelli, Terry, Stout and Kraus, LLP.

(57) ABSTRACT

A plasma processing apparatus and method are capable of performing etching with high precision without damaging the semiconductor wafer. The plasma processing apparatus has a plasma generation power supply for generating a plasma within a processing chamber; a high-frequency power supply for applying a high frequency wave to a sample stage installed within the processing chamber; and control means for controlling the plasma generation power supply or the high-frequency power supply based on parameter settings for an output intensity and an output mode for each process step. In this regard, when the process steps are switched, the control means compares parameters for a current process step with those for a next process step and then switches either the output intensities or the output modes before switching the output modes or the output intensities, respectively.

12 Claims, 6 Drawing Sheets

| CASE | CURRENT STEP | NEXT STEP | SWITCHING TIMING | WHETHER ANY DAMAGE MIGHT BE POSSIBLY CAUSED |
|------|--------------|-----------|------------------|---------------------------------------------|
| 1 | CONTINUOUS OUTPUT MODE | MODULATION OUTPUT MODE | OUTPUT MODE SWITCHING BEFORE OUTPUT INTENSITY SWITCHING | NO DAMAGE |
| 2 | CONTINUOUS OUTPUT MODE | MODULATION OUTPUT MODE | OUTPUT INTENSITY SWITCHING BEFORE OUTPUT MODE SWITCHING | DAMAGE MIGHT BE CAUSED |
| 3 | MODULATION OUTPUT MODE | CONTINUOUS OUTPUT MODE | OUTPUT MODE SWITCHING BEFORE OUTPUT INTENSITY SWITCHING | DAMAGE MIGHT BE CAUSED |
| 4 | MODULATION OUTPUT MODE | CONTINUOUS OUTPUT MODE | OUTPUT INTENSITY SWITCHING BEFORE OUTPUT MODE SWITCHING | NO DAMAGE |

FIG. 4

| CASE | CURRENT STEP | NEXT STEP | SWITCHING TIMING | WHETHER ANY DAMAGE MIGHT BE POSSIBLY CAUSED |
|---|---|---|---|---|
| 1 | CONTINUOUS OUTPUT MODE | MODULATION OUTPUT MODE | OUTPUT MODE SWITCHING BEFORE OUTPUT INTENSITY SWITCHING | NO DAMAGE — graph showing output intensity vs. time with switching timing difference between MODE SWITCHING and OUTPUT INTENSITY SWITCHING |
| 2 | | | OUTPUT INTENSITY SWITCHING BEFORE OUTPUT MODE SWITCHING | EXECUTION OF PROCESS STEPS a, e, f, g, AND h SHOWN IN FIG. 2 CAN PREVENT DAMAGE FROM BEING CAUSED IN THIS CASE |
| 3 | MODULATION OUTPUT MODE | CONTINUOUS OUTPUT MODE | OUTPUT MODE SWITCHING BEFORE OUTPUT INTENSITY SWITCHING | EXECUTION OF PROCESS STEPS a, b, c, AND d SHOWN IN FIG. 2 CAN PREVENT DAMAGE FROM BEING CAUSED IN THIS CASE |
| 4 | | | OUTPUT INTENSITY SWITCHING BEFORE OUTPUT MODE SWITCHING | NO DAMAGE — graph showing output intensity vs. time with switching timing difference between OUTPUT INTENSITY SWITCHING and MODE SWITCHING |

FIG. 5

| STEP | ... | 3 | 4 | 5 | ... |
|---|---|---|---|---|---|
| TYPE | ... | MAIN ETCHING | SWITCHOVER STEP | OVERETCHING | ... |
| TIME | ... | 10s | 1s | 10s | ... |
| OUTPUT MODE | ... | MODULATION OUTPUT | MODULATION OUTPUT | CONTINUOUS OUTPUT | ... |
| OUTPUT INTENSITY | ... | 100W | 10W | 10W | ... |
| ⋮ | ⋮ | ⋮ | ⋮ | ⋮ | ⋮ |

PLASMA PROCESSING APPARATUS AND METHOD

BACKGROUND OF THE INVENTION

The present invention relates to a plasma processing apparatus and method; and, more particularly, the invention relates to a plasma processing apparatus and method which employ a high-frequency power supply for performing plasma processing on a sample, such as a semiconductor wafer.

Known plasma processing apparatuses, such as those disclosed in Japanese Patent Publication No. 4-69415 and Japanese Patent Laid-Open No. 2001-85395, modulate microwave power or high-frequency power that has been applied to an electrode so as to control the proportion of ions or radicals in a plasma for the purpose of enhancing the accuracy of etching of a semiconductor wafer. These publications also describe techniques that are capable of controlling ion energy so as to carry out high-precision etching.

Figure 6:
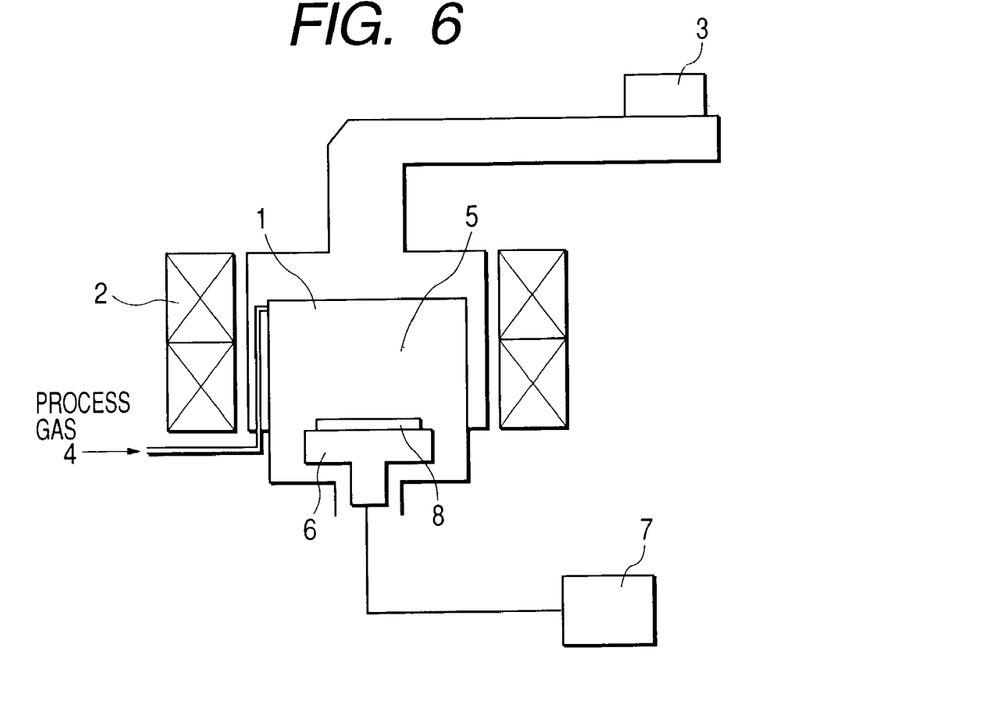
FIG. 6 is a schematic diagram showing a conventional etching apparatus.

Etching apparatuses using a plasma to process a semiconductor water are widely used. One example is an etching apparatus employing an ECR (electron cyclotron resonance) system. FIG. 6 shows an example of such a system. In this system, a DC current is passed through a solenoid coil disposed outside of a chamber 1 so as to produce a magnetic field within the chamber. Furthermore, a high voltage is applied to an oscillator 3 so as to generate, for example, a microwave, which is then introduced into the chamber. An electron cyclotron resonance (ECR) occurs due to the synergistic effect of the microwave and the magnetic field, turning a process gas 4, that has been introduced into the chamber, into an ECR plasma 5. High-frequency power is applied to an electrode 6 by a high-frequency bias power supply 7 so as to attract ions that are included in the plasma in a direction perpendicular to the surface of a semiconductor wafer 8. In addition, the incident ion energy is independently controlled so as to carry out anisotropic etching with high precision.

Generally, each of the many parameters used for performing an etching process is set to a certain value or mode beforehand. These parameters include the processing time, the pressure within the vacuum chamber, the intensity of the current that passes through the solenoid coil, the intensity of the microwave power, the amount of the introduced process gas, and the intensity of the high-frequency power that is applied to the electrode. The control microcomputer included in the etching apparatus simultaneously controls each component device that is necessary to perform the required processing. Furthermore, if the etching process includes a plurality of process steps, the control microcomputer controls the value or the mode for each component device based on the parameter setting for the next process step, each time process steps are switched. A series of parameter settings for an etching process made up of a single or a plurality of process steps is hereinafter referred to as "a recipe".

A description will be given of the modulation of the output of the high-frequency bias power supply 7. To carry out the desired processing with high precision, the output typically is turned on for only a certain period (indicated by a duty ratio) in a given interval and is turned off for the remaining period in the interval, and this operation may be repeated, for example. In this case, the actual output power of the high-frequency bias power supply 7 is equal to the product of the peak value of the high-frequency power (hereinafter referred to as "the output intensity") and the duty ratio. It is known that a strong correlation exists between this actual output power and the etching speed. Therefore, to realize the same etching speed as that obtained with the continuous mode (in which the output is not modulated), a modulation with a duty ratio of 10% requires an output intensity approximately 10 times as high as that for the continuous mode, so as to obtain the actual output power of the continuous mode.

Furthermore, the entire etching process may be made up of individual process steps in which the high-frequency power applied to the electrode is modulated (the modulation output mode) and those in which the high-frequency power is continuously output (the continuous output mode) in combination. For example, the process steps for main etching may be carried out in the modulation output mode, while the process steps (overetching process steps) for removing portions unintentionally left unetched are carried out in the continuous output mode.

However, when a performance improvement utilizing such a modulation mode output function was studied, occurrences of unexpected wafer damage were encountered. The investigation by the inventors of the cause of the damage has revealed that use of a recipe including certain process steps may cause such damage, for the following reasons.

Figure 7:
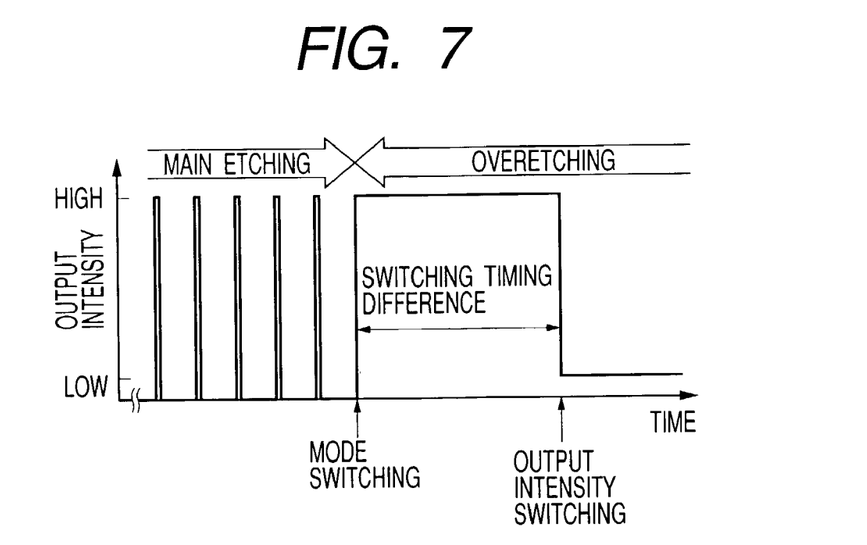
FIG. 7 is a diagram showing a switching timing at which a semiconductor wafer is damaged in the course of a conventional method.

In particular, it was found that a problem arose when a main etching process step was switched to an overetching process step. Specifically, in actual practice, the timings of the output mode switching and the output intensity switching in the high-frequency power supply 7 do not always fully coincide with each other (even though they are required to coincide). The inventors found that, in some cases, the output mode switching tended to occur before the output intensity switching. FIG. 7 shows an example of this phenomenon. In this case, in the continuous output mode, a magnitude of power 10 times as large as a preset power value (that is, the output intensity set for the modulation mode at the previous process step) is applied continuously to the semiconductor wafer 8 for the time period corresponding to the timing difference (the larger the timing difference, the more significant the damage to the semiconductor wafer 8). The switching timing difference is caused by the time difference between the issuance of the output mode switching instruction and the output intensity switching instruction sent from the control microcomputer to the high-frequency power supply 7, by variations in the delay time of the relays and the electronic components in the power supply, etc.

The present invention has been devised in view of the above problem. It is, therefore, an object of the present invention to provide a plasma processing apparatus and method that are capable of carrying out a processing with high precision, without damaging the semiconductor wafer.

SUMMARY OF THE INVENTION

To solve the above-described problem, the present invention has adopted the following features.

According to the present invention, a plasma processing apparatus comprises: a processing chamber for processing a sample; a plasma generation power supply for generating a plasma within the processing chamber; a high-frequency power supply for applying a high frequency wave to a sample stage installed within the processing chamber; and control means for controlling the plasma generation power supply or the high-frequency power supply based on parameter settings for an output intensity and an output mode for each process step; wherein, when the process steps are switched, the control means compares parameters for a current process step with those for a next process step and then switches either the output intensities or the output modes before switching the output modes or the output intensities, respectively.

DESCRIPTION OF THE PREFERRED EMBODIMENTS

Figure 1:
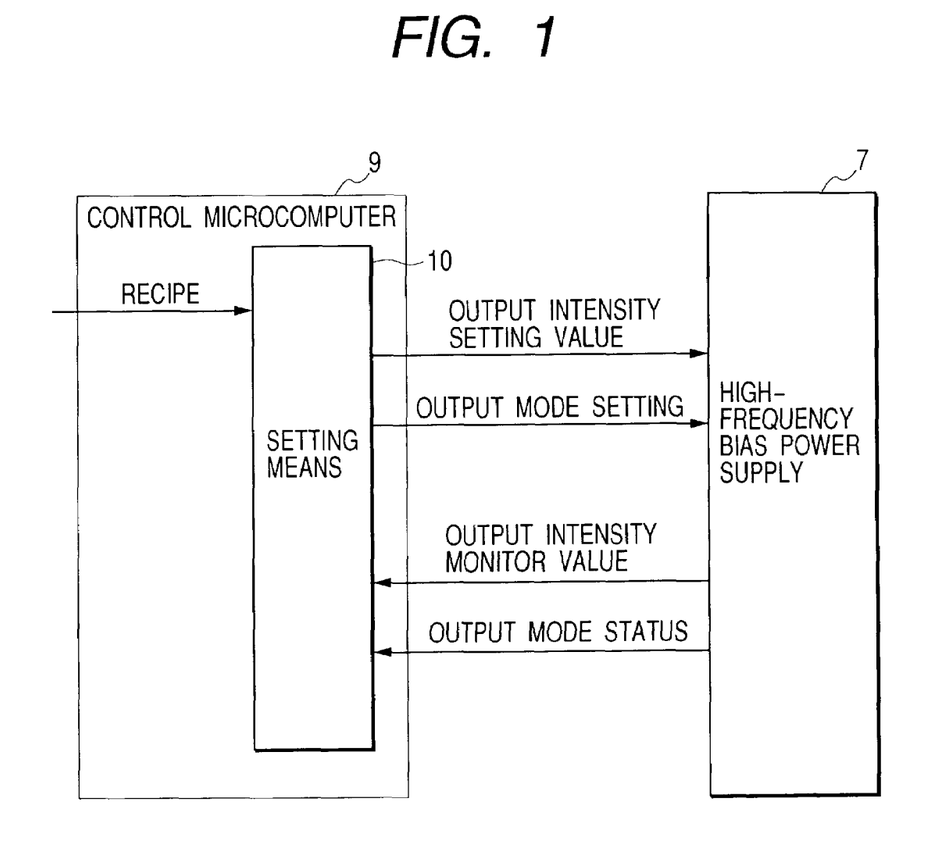
FIG. 1 is a block diagram showing a first embodiment of the present invention.

A first embodiment of the present invention will be described below with reference to the accompanying drawings. FIG. 1 shows an embodiment of the present invention. FIG. 1 omits all the components shown in FIG. 6 except for the high-frequency bias power supply 7. Reference numeral 9 denotes an etching apparatus control microcomputer for issuing instructions to the component devices, such as the high-frequency bias power supply 7, based on a recipe specified for an etching process beforehand, and for monitoring the conditions of the apparatus. Reference numeral 10 denotes a setting means, which forms the backbone of the present invention, for applying an output intensity setting value and an output mode setting to the high-frequency bias power supply 7 upon receiving a recipe and the output intensity monitor value and the output mode status of the high-frequency bias power supply 7.

The output intensity setting value and the output intensity monitor value each may be set to a range from a DC signal voltage of 0V to 10V, corresponding to a range from the output power 0 W to the maximum output power value of the high-frequency bias power supply 7. Further, as for the output mode setting and the output mode status, a high level and a low level may be used to indicate the continuous output mode and the modulation output mode, respectively.

The (process) steps a to h, performed by the setting means 10, will be described with reference to FIG. 2.

Step a: it is determined whether switching from the modulation output mode to the continuous output mode is to be carried out between process steps. If it is determined that switching is to be carried out (the answer is yes), the process flow proceeds to process step b; otherwise the process flow proceeds to step e.

Step b: instructs that the output intensities be switched at the next step. This step is carried out if the answer to the determination at step a is yes.

Step c: after step b, it is determined whether the output intensities have already been switched. If it is determined that the output intensities have not yet been switched (the answer is no), this step is repeated; otherwise the process flow proceeds to step d.

Step d: instructs that the output modes be switched. This step is carried out if the answer to the determination at step c is yes.

Step e: it is determined whether switching from the continuous output mode to the modulation output mode is to be carried out between process steps. If it is determined that switching is to be carried out (the answer is yes), the process flow proceeds to step f. This step is carried out if the answer to the determination at step a is no.

Step f: instructs that the output modes be switched at the next step. This step is carried out if the answer to the determination at step e is yes.

Step g: after step e, it is determined whether the output modes have already been switched. If it is determined that the output modes have not yet been switched (the answer is no), this step is repeated; otherwise the process flow proceeds to step h.

Step h: instructs that the output intensities be switched. This step is carried out if the answer to the determination at step g is yes.

The steps in the above process flow, which instruct that the output intensities be switched, actually notify the high-frequency bias power supply 7 of the output intensity for the next process step. Likewise, the steps which instruct that the output modes be switched actually notify the high-frequency bias power supply 7 of the output mode for the next process step.

Further, the determination whether the output intensities have already been switched may be made by determining whether the output intensity monitor value is within a predetermined range around the output intensity setting value. Alternatively, the determination may be made by determining whether a certain time has elapsed. The time may be predetermined by adding a safety margin to the switching time that has been determined based on the specifications of the high-frequency bias power supply. Likewise, the determination whether the output modes have already been switched may be made by determining whether the output mode status coincides with the set output mode. Alternatively, the determination may be made by determining that a certain time has elapsed. The time also may be predetermined by adding a safety margin to the switching time that has been determined based on the specifications of the high-frequency bias power supply.

The problem to be solved by the invention described above is outlined as follows.

The problem may arise when a main etching process step is carried out in the modulation output mode and an overetching process step is subsequently carried out in the continuous output mode. When the main etching process step is switched to the overetching process step, if the timings of the output mode switching and the power value (output intensity) switching in the high-frequency power supply do not fully coincide with each other, and, as a result, the output mode switching occurs before the power value switching, a magnitude of power 10 times as large as an ordinary power value may be applied to the semiconductor wafer in the continuous output mode, thereby damaging the semiconductor wafer.

Figure 3:
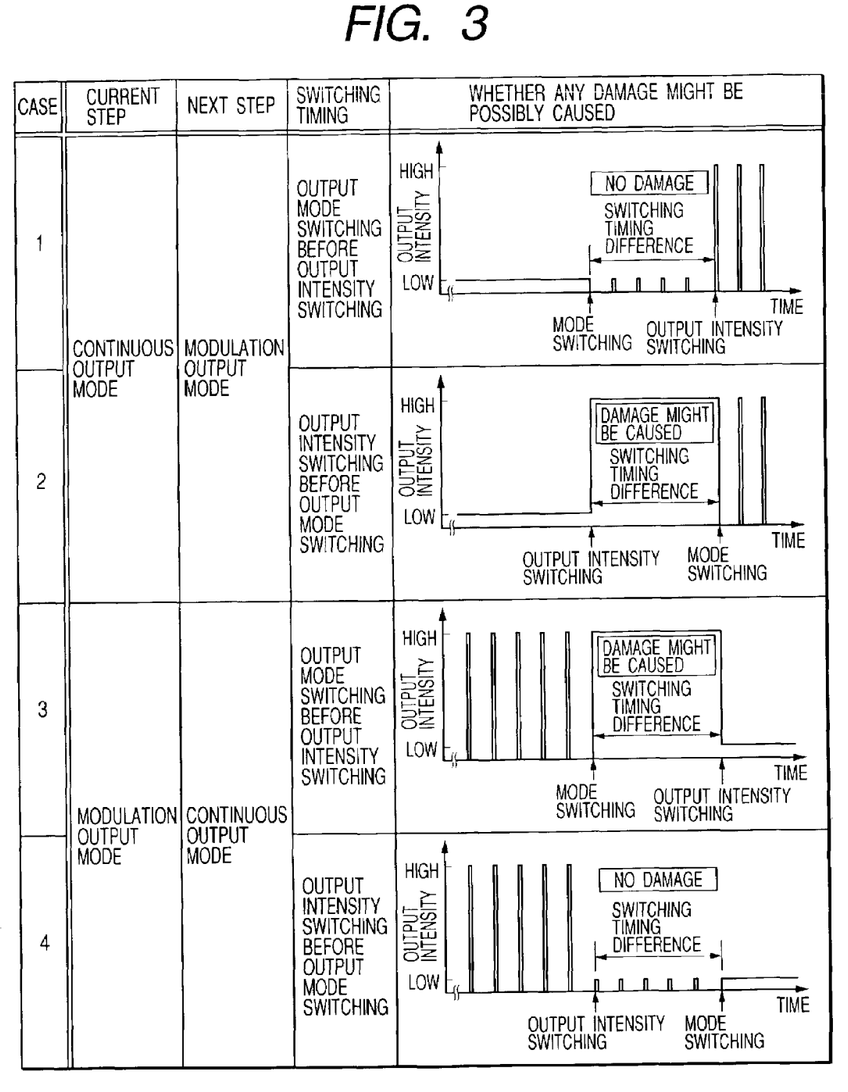
FIG. 3 is a diagram showing whether or not each combination (case) may possibly damage a semiconductor wafer.

FIG. 3 shows each possible combination (case) of the order of the two sequential process steps and the switching timing and whether the combination may possibly damage the semiconductor wafer. Specifically, FIG. 3 checks to determine whether any problem, which may damage the semiconductor wafer, arises when the output modes are switched before the output intensities are switched, and vice versa. It should be noted that the cases shown in FIG. 3 assume that the output intensity for the modulation output mode is considerably higher than that for the continuous output mode, for example, cases where the former is 10 times higher than the latter.

Case 1
Current step: continuous output mode, low output intensity
Next step: modulation output mode, high output intensity
Switching timing: the output mode switching is carried out before the output intensity switching Case 2
Current step: continuous output mode, low output intensity
Next step: modulation output mode, high output intensity
Switching timing: the output intensity switching is carried out before the output mode switching Case 3
Current step: modulation output mode, high output intensity
Next step: continuous output mode, low output intensity
Switching timing: the output mode switching is carried out before the output intensity switching Case 4
Current step: modulation output mode, high output intensity
Next step: continuous output mode, low output intensity
Switching timing: the output intensity switching is carried out before the output mode switching In Case 1, when the two process steps are switched, the timing difference between the modulation output mode switching and the output intensity switching produces a time period having the state "low output intensity in modulation output mode". However, this state does not damage the semiconductor wafer. In Case 2, on the other hand, the switching timing difference produces a corresponding time period having the state "high output intensity in continuous output mode", which may damage the semiconductor wafer. Similarly, in Case 3, damage to the semiconductor wafer may result.

Figure 2:
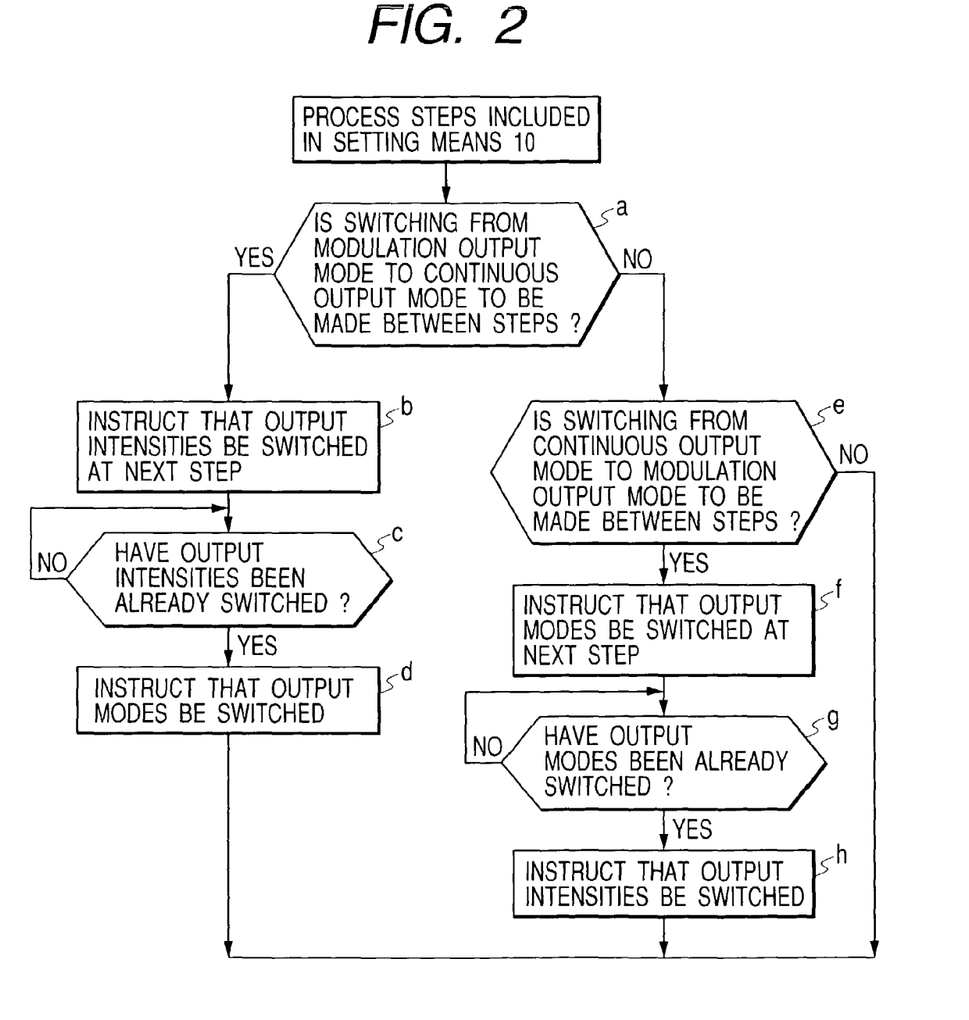
FIG. 2 is a process flow diagram showing the function of a setting means.
Figure 4:
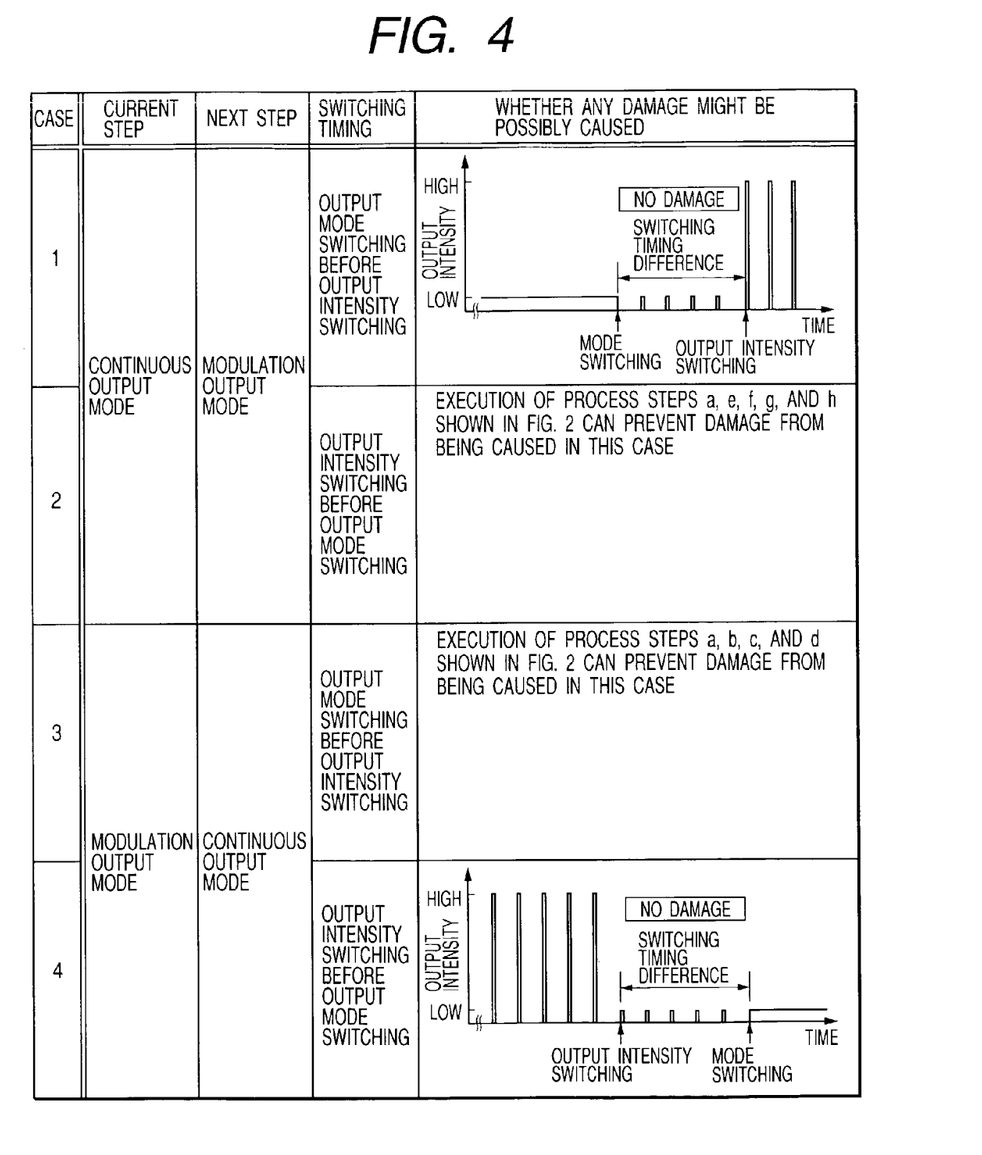
FIG. 4 is a diagram showing whether or not each combination (case) may possibly damage a semiconductor wafer when an embodiment of the present invention is applied.

The first embodiment of the present invention, which is illustrated in FIGS. 1 and 2, has been devised to solve such a problem. The operation of the first embodiment, when applied to the above-described problem, is shown in FIG. 4. According to the first embodiment, when the continuous output mode is switched to the modulation output mode, steps a, e, f, g, and h shown in FIG. 2 are sequentially performed to switch the output modes before switching the output intensities, preventing occurrence of the event in Case 2. When the modulation output mode is switched to the continuous output mode, on the other hand, steps a, b, c, and d are sequentially performed to switch the output intensities before switching the output modes, preventing occurrence of the event in Case 3.

As described above, the present embodiment can automatically prevent unexpected damage to the semiconductor wafer which might be caused when the output modes are switched between process steps. Therefore, it is possible to provide a plasma processing apparatus that is capable of performing etching with high precision and enhance the product safety of the semiconductor wafer. Further, even when a number of recipes are prepared for an etching process, it is not necessary to check the parameter settings for each two sequential steps beforehand to prevent any damage to the semiconductor wafer, which contributes to quick product development.

Still further, the function of the setting means 10 may be implemented by software executed by the control microcomputer 9. In the case where the switching instructions are sent together from the control microcomputer 9 to the high-frequency bias power supply 7 using serial communication or another means, the function of the setting means 10 may be included in the high-frequency bias power supply 7. On the other hand, if the current etching apparatus is already made up of a conventional control microcomputer 9 and high-frequency bias power supply 7, the function may be implemented in hardware provided separately from these devices and inserted between the control microcomputer 9 and the high-frequency bias power supply 7. With this arrangement, the present embodiment can be realized by adding a small change to the conventional apparatus without changing the control microcomputer 9 and the high-frequency bias power supply 7 at all.

The above description was directed to the modulation of the output of a high-frequency bias power supply. However, the present invention can be applied to not only (modulation of the output of) high-frequency bias power supplies, but also to modulation of the output of plasma source power supplies, for example. Further, in the above description of the modulation of the output, the output is turned on for only a certain period (indicated by a duty ratio) in a given interval and is turned off during the remaining period of that interval, and this operation is repeated. However, the present invention can be applied to another modulation system, such as (the so-called) amplitude modulation system, in which the amplitude curve of the high-frequency output power is set to have a sinusoidal waveform of a low frequency. The output intensity for the modulation output mode may also be set to be higher than the output intensity for the continuous mode according to the degree of the modulation. Also, in this case, the present embodiment can prevent an output intensity of excessive magnitude from being produced in the continuous output mode at the time of switching the output modes.

Figure 5:
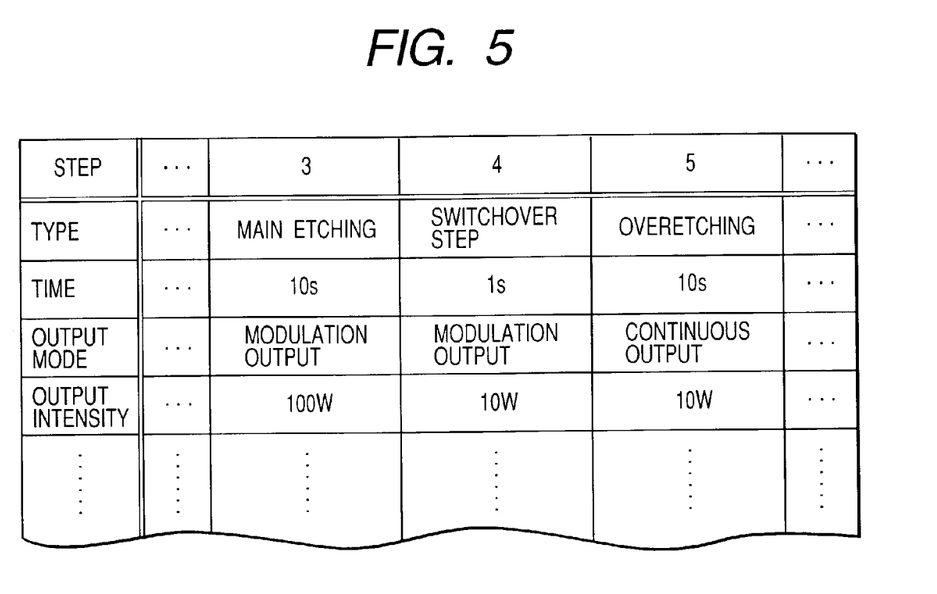
FIG. 5 is a diagram showing a second embodiment of the present invention.

A second embodiment of the present invention will be described with reference to FIG. 5. FIG. 5 shows a table in which each row indicates a respective one of the setting items for a recipe, such as the duration, the output mode, and the output intensity of each process step. The process steps to be employed, such as main etching and overetching, are arranged from left to right sequentially. FIG. 5 illustrates an example in which an output intensity of 100 W is employed for the modulation output mode, whereas an output intensity of 10 W is employed for the continuous output mode.

The present embodiment is characterized in that a process step (corresponding to the switchover step in FIG. 5) is provided between the main etching and the overetching to switch to the modulation output mode with an output of 10 W. The switchover step reliably reduces the output intensity to 10 W before the overetching process step switches to the continuous output mode.

Adding a switchover step increases the entire processing time by a corresponding time period (1 second in this example). Furthermore, it is necessary to check whether a switchover step is required for each two sequential process steps. However, the present embodiment produces the same effect as that of the first embodiment in terms of prevention of damage to the semiconductor wafer.

As described above, the present invention can provide a plasma processing apparatus and method that are capable of performing etching with high precision, without damaging the semiconductor wafer.

The invention claimed is:

1. A plasma processing apparatus comprising:
   a processing chamber for processing a sample;
   a plasma generation power supply for generating a plasma within said processing chamber;
   a high-frequency power supply for applying a high frequency wave to a sample stage installed within said processing chamber; and
   control means for controlling said plasma generation power supply or said high-frequency power supply based on parameter settings for an output intensity and an output mode for each process step;
   wherein said plasma generation power supply or said high-frequency power supply has a continuous output mode and a modulation output mode;
   wherein when said process steps are switched, said control means compares parameters for a current process step with those for a next process step and then switches either said output intensities or said output modes before switching said output modes or said output intensities, respectively;
   wherein when said continuous output mode is switched to said modulation output mode, said control means switches said output modes before switching said output intensities; and
   wherein an output intensity in said modulation output mode is higher than an output intensity in said continuous output mode.

2. The plasma processing apparatus as claimed in claim 1 wherein when said modulation output mode is switched to said continuous output mode, said control means switches said output intensities before switching said output modes.

3. The plasma processing apparatus as claimed in claim 2 wherein an output intensity in said continuous output mode is lower than an output intensity in said modulation output mode.

4. A plasma processing apparatus comprising:
   a processing chamber for processing a sample;
   a plasma generation power supply for generating a plasma within said processing chamber;
   a high-frequency power supply for applying a high frequency wave to a sample stage installed within said processing chamber; and
   control means for controlling said plasma generation power supply or said high-frequency power supply based on parameter settings for an output intensity and an output mode for each process step;
   wherein said plasma generation power supply or said high-frequency power supply has a continuous output mode and a modulation output mode;
   wherein when said process steps are switched, said control means compares parameters for a current process step with those for a next process step and then switches either said output intensities or said output modes before switching said output modes or said output intensities, respectively; and
   wherein when said output intensity is increased at a time of switching said process steps, said control means switches said output modes before switching said output intensities.

5. The plasma processing apparatus as claimed in claim 4 wherein when said output intensity is decreased at a time of switching said process steps, said control means switches said output intensities before switching said output modes.

6. A plasma processing method wherein a plasma is generated within a processing chamber by use of a plasma generation power supply, a high frequency wave is applied to a sample stage installed within said processing chamber by use of a high-frequency power supply, and a sample mounted on said sample stage is processed, said method comprising the steps of:
   controlling said plasma generation power supply or said high-frequency power supply based on parameter settings for an output intensity and an output mode for each process step;
   wherein said plasma generation power supply or said high-frequency power supply has a continuous output mode and a modulation output mode;
   when said process steps are switched, comparing parameters for a current process step with those for a next process step, and then switching either said output intensities or said output modes before switching said output modes or said output intensities, respectively, to process said sample;
   when said continuous output mode is switched to said modulation output mode, switching said output modes before switching said output intensities to process said sample; and
   wherein an output intensity in said modulation output mode is made higher than an output intensity in said continuous output mode to process said sample.

7. The plasma processing method as claimed in claim 6, wherein
   said modulation output mode is switched to said continuous output mode, switching said output intensities before switching said output modes to process said sample.

8. The plasma processing method as claimed in claim 7 wherein an output intensity in said continuous output mode is made lower than an output intensity in said modulation output mode to process said sample.

9. A plasma processing method wherein a plasma is generated within a processing chamber by use of a plasma generation power supply, a high frequency wave is applied to a sample stage installed within said processing chamber by use of a high-frequency power supply, and a sample mounted on said sample stage is processed, said method comprising the steps of:
   controlling said plasma generation power supply or said high-frequency power supply based on parameter settings for an output intensity and an output mode for each process step;
   wherein said plasma generation power supply or said high-frequency power supply has a continuous output mode and a modulation output mode;
   when said process steps are switched, comparing parameters for a current process step with those for a next process step, and then switching either said output intensities or said output modes before switching said output modes or said output intensities, respectively, to process said sample; and
   when said output intensity is increased at a time of switching said process steps, switching said output modes before switching said output intensities to process said sample.

10. The plasma processing method as claimed in claim 9 wherein when said output intensity is decreased at a time of switching said process steps, switching said output intensities before switching said output modes to process said sample.

11. A plasma processing method wherein a plasma is generated within a processing chamber by use of a plasma generation power supply, a high frequency wave is applied to a sample stage installed within said processing chamber by use of a high-frequency power supply, and a sample mounted on said sample stage is processed, said method comprising the steps of:

controlling said plasma generation power supply or said high-frequency power supply based on parameter settings for an output intensity and an output mode for each process step;

when a modulation output mode is to be switched to a continuous output mode between a current process step and a next process step, performing a process step of maintaining said modulation output mode but switching to said output intensity for said next process step to process said sample, said process step being provided between said current process step and said next process step; and when said continuous output mode is to be switched to said modulation output mode between said current process step and said next process step, performing another process step of switching to said modulation output mode but maintaining said output intensity for said current process step to process said sample, said another process step being provided between said current process step and said next process step.

12. A plasma processing method wherein a plasma is generated within a processing chamber by use of a plasma generation power supply, a high frequency wave is applied to a sample stage installed within said processing chamber by use of a high-frequency power supply, and a sample mounted on said sample stage is processed, said method comprising the steps of:

controlling said plasma generation power supply or said high-frequency power supply based on parameter settings for an output intensity and an output mode for each process step;

when said output intensity is increased at a time of switching from a current process step to a next process step, performing a switchover process step of switching to said output mode for said next process step but maintaining said output intensity for said current process step to process said sample; and when said output intensity is decreased at a time of switching from said current process step to said next process step, performing another switchover process step of maintaining said output mode for said current process step but switching to said output intensity for said next process step to process said sample.

* * * * *